United States Patent [19]

Yoshida et al.

[11] Patent Number: 5,379,717
[45] Date of Patent: Jan. 10, 1995

[54] METHOD OF GROWING SINGLE CRYSTAL OF COMPOUND SEMICONDUCTORS

[75] Inventors: Seikoh Yoshida, Toride; Shoichi Ozawa, Yokohama; Toshio Kikuta, Fujisawa, all of Japan

[73] Assignee: The Furukawa Electric Co., Ltd., Tokyo, Japan

[21] Appl. No.: 63,344

[22] Filed: May 18, 1993

Related U.S. Application Data

[63] Continuation of Ser. No. 751,313, Aug. 28, 1991, abandoned.

[30] Foreign Application Priority Data

Aug. 30, 1990 [JP] Japan ................. 2-228822
Oct. 19, 1990 [JP] Japan ................. 2-281443
Oct. 19, 1990 [JP] Japan ................. 2-281444

[51] Int. Cl.⁶ .................................................. C30B 15/28
[52] U.S. Cl. ............................................ 117/14; 117/13; 117/201; 117/208
[58] Field of Search .................. 156/601, 607, 616.1, 156/616.4, 617.1, 620.2, DIG. 89

[56] References Cited

U.S. PATENT DOCUMENTS

| | | | |
|---|---|---|---|
| 3,980,438 | 9/1976 | Castonguay et al. | 156/617.1 |
| 4,668,481 | 5/1987 | Watanabe et al. | 422/249 |
| 4,678,534 | 7/1987 | Tada et al. | 156/607 |
| 4,846,527 | 7/1989 | Takahashi | 156/618.1 |
| 5,089,238 | 2/1992 | Araki et al. | 422/249 |

*Primary Examiner*—R. Bruce Breneman
*Assistant Examiner*—Felisa Garrett
*Attorney, Agent, or Firm*—Vineet Kohli; Thomas R. Morrison

[57] ABSTRACT

A method of growing a single semiconductor crystal with a flat top. In order to grow a single flat top crystal, the InP crystal is pulled up after the temperature drop of the melt has almost stopped, at a point in time when a meniscus at the interface of solid-liquid can be seen over the whole circumference of the surface of the melt. This prevents a facet from appearing at the shoulder portion of the crystal, thus reducing the generation of twin crystals and drastically improves retension of single crystal formation.

14 Claims, 6 Drawing Sheets

Distance from center of melt (cm)

METHOD OF GROWING SINGLE CRYSTAL OF COMPOUND SEMICONDUCTORS

This is a continuation of co-pending application Ser. No. 07/751,313, filed on Aug. 28, 1991 now abandoned.

BACKGROUND OF THE INVENTION

The present invention relates to a method of growing single crystal of compound semiconductors having suppressed the generation of twin crystal from the shoulder portion of the single crystal to be pulled up and, in particular, relates to a method of growing single crystal of Inp not liable to generate the twin crystal.

Traditionally, in the growing method of single crystal of compound semiconductors by liquid encapsulated Czocharalski method (LEC method), as shown in FIG. 1, a heater (3) and a crucible (4) are installed in a hot zone (2) provided in a high-pressure chamber (1), an inert gas (9) is filled up inside the high pressure chamber (1), anti a melt (13) of raw material of compound semiconductor is retained in the crucible (4), the top surface of which is covered with a liquid encapsulant (12). A crucible shaft (7) is provided at the lower end of crucible (4) so that the crucible (4) can be rotated and, above the crucible (4), a rotatable pulling-up shaft (8) attached with a seed crystal (10) at the lower end thereof is provided. By pulling up the seed crystal (10) contacting with the top surface of melt (13) of raw material, the melt (13) of raw material is solidified gradually to grow a single crystal (11) on the seed crystal (10). Additionally, in the diagram, numeral (5) indicates a thermocouple and numeral (6) indicates an electrode.

Further, in order to grow the single crystal practically, the seed crystal having a particular planar orientation, for example, (001) orientation or (111) orientation is dipped into the surface of the melt of raw material and the seed crystal is grown while gradually cooling the melt, thus giving an improved a fixed shoulder angle to the growing crystal, as it is drawn up is better. By doing so, it is possible to grow the single crystal while suppressing the generation of twin crystal or poly crystal.

When pulling up the single crystal giving a fixed shoulder angle as described above, with materials having a small layer defect energy such as, for example, InP etc., the twin crystal is liable to generate from the shoulder portion thereof, leading to the difficulty in single-crystallization.

OBJECTS & SUMMARY OF THE INVENTION

One object of the invention is characterized in that, in the growing method of single crystal of compound semiconductors by so-called liquid encapsulated Czocharalski method, wherein a melt of raw material of compound semiconductor and a crucible accommodated a liquid encapsulant covering the top surface of said melt are installed in a high-pressure vessel filled up with an inert gas and, after contacted a seed crystal of compound semiconductor with the top surface of the melt of raw material, the seed crystal is pulled upward, thereby gradually solidifying the melt of raw material to grow the single crystal, the crystal is grown on the seed crystal by decreasing the temperature of melt by 6° to 12° C. after dipping the seed crystal into the top surface of the melt of the raw material, the temperature at the central portion of melt is first decreased by gradually increasing the rotation of the crucible without drawing up the seed crystal, then, at 0.5 to 2 minutes later, the temperature of melt is further gradually cooled at a lowering rate of −0.21° to −0.88° C./min to grow the crystal transversely, and, when the crystal has reached a designated shape, the seed crystal is pulled up at a fixed velocity.

Moreover, the invention is characterized in that, upon growing the single crystal of InP by flat top mode using the liquid encapsulated Czocharalski method, the crystal at the beginning of growth is grown laterally in the surface of the melt of InP, then, at the point the time when a size of the crystal in the surface of said melt has reached 30 to 40 mm square, the lateral growth is stopped and further, at the point of time when the meniscus at the interface of solid-liquid can be seen over the whole circumference of the surface of melt, the crystal is pulled up at a pulling-up velocity of not less than 7 mm/hr, thereby pulling up the single crystal so the facet does not appear at the shoulder portion of the crystal.

Furthermore, the invention is characterized in that, in the growth of the single crystal of compound semidonductors by flat top shape according to the liquid encapsulated Czocharalski method, a crucible with D−d=5 to 15 mm is used, when putting the inner diameter of the crucible for pulling up the single crystal at D mm and the outer diameter of single crystal to be pulled up at d mm, and the distribution of temperature in the radial direction of melt during the growth of crystal is made so that the temperature is lower as it approaches to the central portion of melt to perform the pulling-up of crystal.

DETAILED DESCRIPTION OF THE INVENTION

Figure 1:
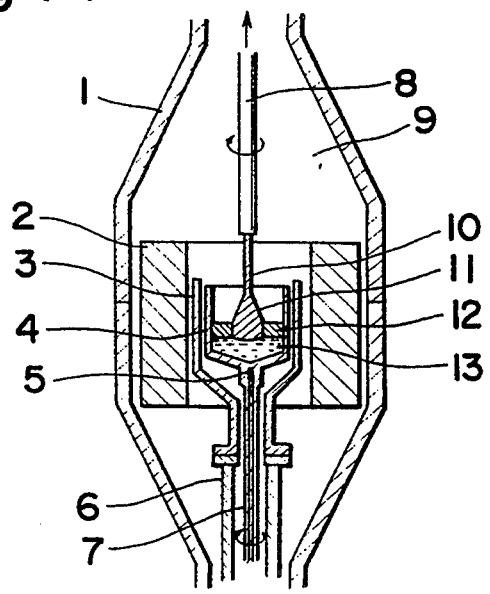
FIG. 1 is an outline diagram showing one example of the conventional growing method of the single crystal of compound semiconductor.

As described, in the first invention, the single crystal is pulled up a flat top shape. The tip of the seed crystal is dipped into the melt of raw material by bringing the seed crystal down into the melt of raw material and, first starting, the growth of crystal without pulling up the seed crystal. While rotating , the seed crystal at approximately 3 rum or so.

In this state, the temperature of the melt is decreased by 6° to 12° C., then, about 0.5 to 2 minutes later, the temperature is decreased at a temperature-lowering rate of $-0.21°$ to $-0.88°$ C./min, thereby the crystal can be grown laterally from the seed crystal. Thereafter, by gradually increasing the number of rotation of the crucible, the crystal is made even larger. Since, increasing the rotation of crucible, the temperature at the central portion of melt is usually decreased, the number of the rotations of the crucible is changed from $-5$ rpm to $-15$ rpm, thereby the temperature at the central portion of the melt can be decreased by about 8° C.

In this way, by increasing the rotation of the crucible, the crystal is extended laterally, the shape of crystal is brought close to a required shape, the temperature-lowering rate is made as low as $-0.15°$ C./min, and, when the required diameter (60–65 mm) is added, the seed crystal is pulled upward at a velocity of 10 mm/hr.

In this way, by dipping the seed crystal into the melt and extending the single crystal to the required shape without pulling up the seed crystal, the generation of twin or dendrite can be suppressed and, even if the twin may be incorporated, remelting of the crystal becomes possible. By repeating this process, the head portion of the crystal can be completely single-crystallized thereby permitting drastically improved retention of single-crystallization.

According to a second embodiment of the invention, in the growth of InP single crystal with a diameter of 2 in. by flat top shape using LEC device, InP poly raw material is molten, the tip of the seed is dipped into this, and this state is kept for about 15 minutes, then the growth of crystal is started. At this time, under the control of temperature-lowering and number of rotations of the crucible, the crystal is grown on the seed and this crystal is grown laterally. When the size of the crystal has reached 30 to 40 mm square, the temperature-lowering rate is changed to 0.13° to 0° C./min to stop the growth of crystal. When the lateral growth stops, the meniscus (concave shape of the interface where the melt contacts with the crystal due to interfacial tension) appears at the interface of crystal and melt. When the shape of this meniscus has been stabilized, the pulling-up of crystal is started.

The temperature-lowering rate on stopping the diameter of crystal has a latitude of 0.13° to 0° C./min because, if the temperature of melt on stopping the diameter of crystal is settled a little too high, the temperature-lowering rate is increased to prevent the diameter of crystal from becoming thin after the start of pulling-up. Also, if the temperature of the melt is set a little too low, the temperature-lowering rate is decreased to bring it close to 0° C./min. In this way, by pulling up the crystal at a pulling-up velocity of not less than 7 mm/hr when the shape of meniscus has been stabilized, the pulled-up crystal has no facet at the shoulder portion to give a single crystal.

According to a third embodiment of the invention, in the growth of single crystal of compound semiconductors, for example, InP by flat top shape using LEC method, an InP seed is dipped into the melt after the InP polycrystal in quartz a crucible is molten (Temperature 1070° C.) and the temperature of the melt is decreased stepwise by 7° to 10° C. to produce supercooling and to grow the crystal laterally on the seed. When the crystal has reached a fixed diameter, the crystal is pulled up. At this time, a crucible where D-d=5 to 15 mm is used, if putting the inner diameter of crucible at D mm and the outer diameter of the single crystal to be pulled up at d mm. For example, when using a crucible with an inner diameter of 65 to 70 mm, the crystal is not pulled up until the diameter of InP crystal reaches 55 to 60 mm and, when this diameter, is reached the crystal is pulled up. Further, according to the invention, when bringing the diameter of the crystal close to the diameter of crucible at this time, the head portion of crystal comes out of the about 17 mm thick $B_2O_3$ being an encapsulant covering the melt and the amount of radiation from the surface of the crystal changes, nevertheless it becomes hard to affect the diameter of crystal and the diameter of crystal is easy to control constantly. This is because the lateral distribution of temperature in the melt is maintained so that the temperature is high at the periphery of the crucible and low at the central portion of melt. Namely, since the surface temperature of the crucible is maintained high, even if the amount of radiant heat escaping from the surface of crystal may change a little, it is hard to affect the outer diameter of crystal. In this way, by bringing the diameter of the crystal close to the inner diameter of crucible and making the radial distribution of temperature of melt lower when approaching closer to the central portion of melt, it becomes easy to stably control the outer diameter of the crystal.

As the means to make the radial distribution of temperature of the melt so that the temperature is low at the central portion of the melt and high at the peripheral portion as described, there is a method to control using the pressure of atmospheric gas, a method to control the magnitude of thermal insulation of device for heating the crucible, and the like. For example, if decreasing the pressure of the gas or increasing the efficiency of thermal insulation, the distribution of temperature would tend to become more uniform and, inversely, if increasing the pressure of gas or decreasing the efficiency of thermal insulation, the temperature at the central portion of the melt would become lower.

According to these methods, therefore, the lateral distribution of melt can always be maintained so that the temperature is higher at the peripheral portion permitting the drawing-up of crystal of stabilized shape.

In accordance with the flat top shape of the invention, such remarkable effects can be exerted industrially that it is possible to extend the single crystal to a required shape without pulling up the crystal after seeding. Further, the generation of twin or dendrite can be confirmed without pulling up the single crystal and, even if the twin may be incorporated, the seeding can be repeated by melting the crystal again, the head portion of crystal can be single-crystallized completely by this process, the retention of single-crystallization is also drastically improved.

One of the greatest problems in the single-crystallization by flat top shape lies in the suppression of the generation of twin crystal at the shoulder portion, but the invention exerts remarkable effect in that the generation of facet can be suppressed at the shoulder portion resulting in a very low probability of the generation of twin crystal and drastically improving retention of the single-crystallization of InP.

Moreover, the invention exerts conspicuous effect in that, in the pulling-up of the single crystal of compound semiconductors by the LEC method of flat top shape, the shape of crystal can be maintained stably making it possible to pull up the single crystal in good retention.

EXAMPLE 1

Figure 2:
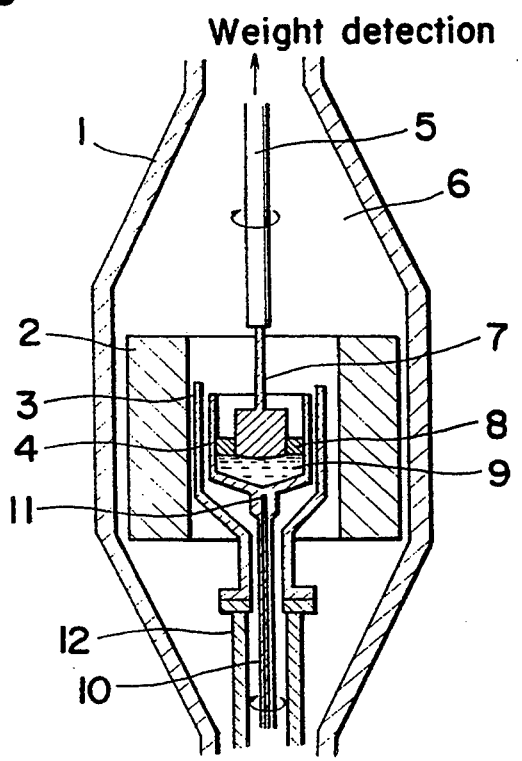
FIG. 2 is an illustration diagram of the LEC device used in the example of the invention.

The growth of the single crystal of InP was performed using the LEC device shown in FIG. 2. In the diagram, numeral (1) indicates high-pressure chamber, numeral (2) indicates hot zone, numeral (3) indicates heater, numeral (4) indicates crucible, numeral (5) indicates pulling-up shaft, numeral (6) indicates inert gas, numeral (7) indicates seed, numeral (8) indicates $B_2O_3$, numeral (9) indicates InP poly raw material, numeral (10) indicates crucible shaft, numeral (11) indicates thermocouple, and numeral (12) indicates electrode. InP poly raw material charged weighed 1.2 kg, $B_2O_3$ weighed 200 g, and, as a crucible, quartz crucible with a 4 in. diameter was used. For the seed of InP, seed with (001) orientation was used. Moreover, the heater was a wine cup heater, the inert gas introduced into the high-pressure chamber was Ar or $N_2$, and the pressure of gas was 35 $kg/cm^2$.

Figure 3:
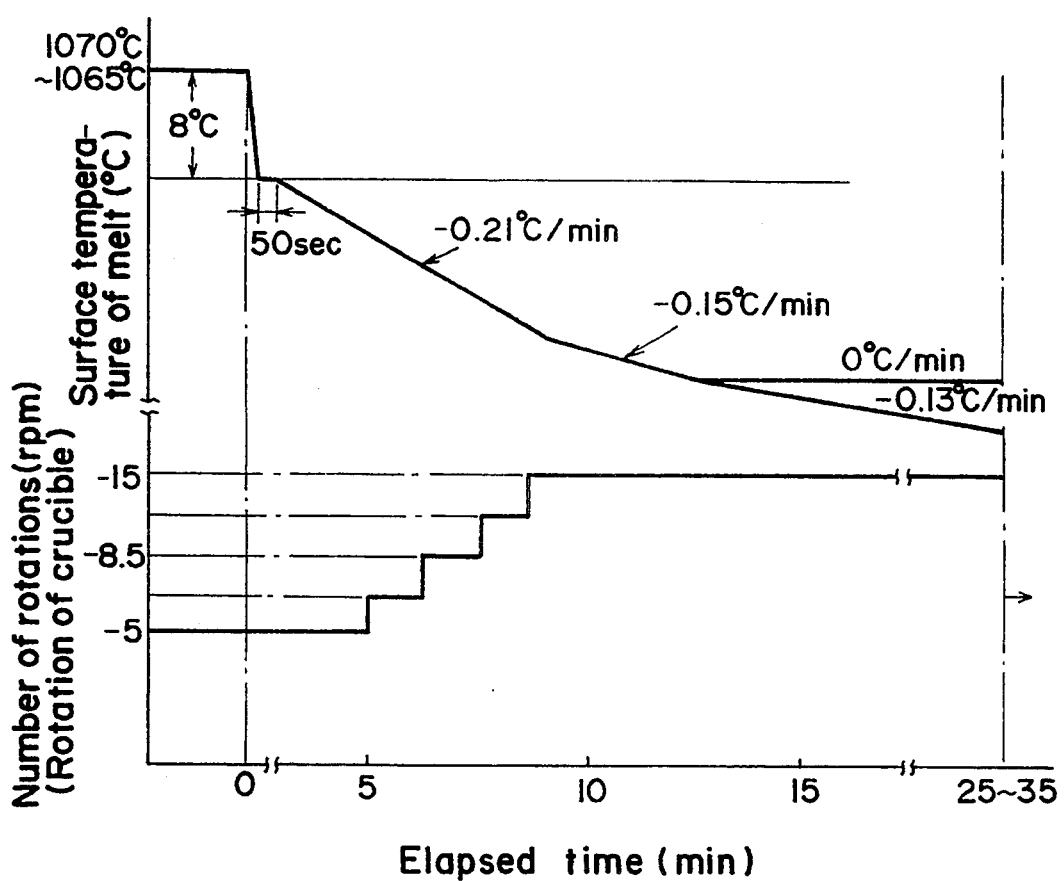
FIG. 3 is an illustration diagram showing how to decrease the melt temperature and the change in the rotation of the crucible over time at the start of growing crystal in the invention.

Initially, InP poly raw material (9) was molten in the crucible (4) (temperature of melt was about 1070° C.). After the melt of InP, the tip of seed (7) was dipped into the melt. After retained in this state for 15 minutes or so, the growth of crystal was started. FIG. 3 shows how to decrease the temperature and change the number of the rotations of crucible over time. Namely, the temperature of the melt is first decreased by 8° C. (7° to 10° C. is suitable) to make supercooling and then the crystal is grown. The temperature-lowering rate is given so the crystal grows in the shape of a square and the number of rotations of the crucible is gradually increased. When the size of crystal has reached 30 to 40 mm square, the temperature-lowering rate is controlled within 0.13° to 0° C./min to stop the lateral growth of the crystal on the surface of melt. At this time, the number of rotations of crucible have already been made constant at −15 rpm.

Figure 4:
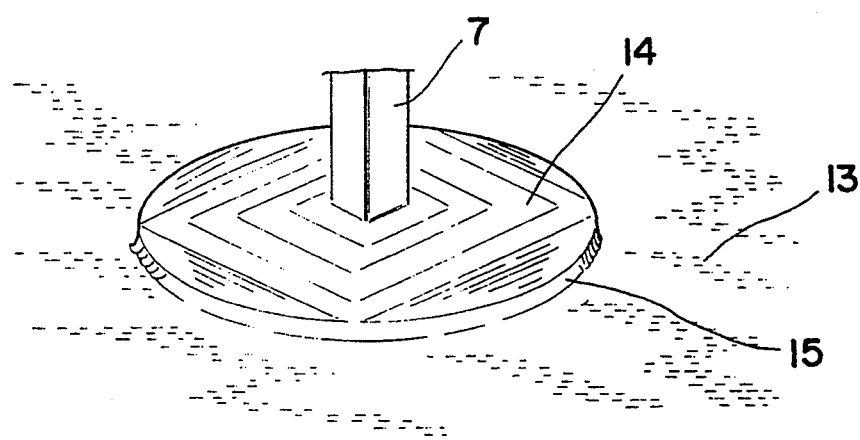
FIG. 4 is a schematic figure showing the meniscus appearing at the interface of solid-liquid when the diameter of the crystal has been stabilized according to the invention.

When the lateral growth of the crystal on the surface of melt stops in this way, as shown in FIG. 4, the meniscus (15) comes to appear at the interface of crystal (14) and melt (13) (25 to 35 minutes later from the point of time when the temperature was lowered by 8° C). At the point of time when the shape of meniscus can be seen stably over the whole circumference of crystal on the surface of melt, the pulling-up of the crystal was started at a velocity of 8 mm/hr.

Figure 5:
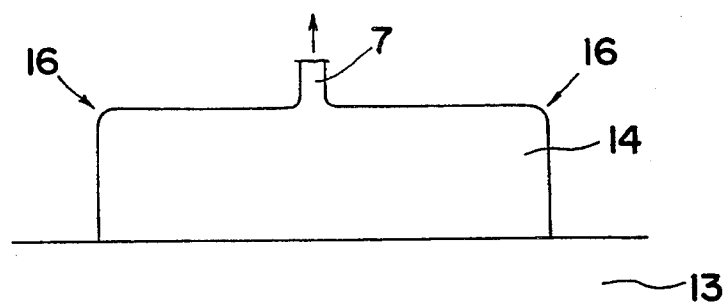
FIG. 5 is a side view showing the vicinity of the shoulder portion when the crystal was pulled up by flat top according to the invention.

The crystal pulled up in this way had a flat top shape as shown in FIG. 5 and no facet face appeared at the shoulder portion (16) to give a single crystal (14) hard to incorporate the twin crystal.

Besides, when the degree of supercooling is high at the beginning of growth (the latitude of stopdown of temperature at the beginning of growth is 15° to 10° C.), the temperature-lowering rate is made to be 0 and the pulling-up is started when it has been stabilized. On the contrary, when the degree of supercooling is low, a temperature-lowering rate of about 0.2° C./min may be given and the crystal may be pulled up at a velocity of 10 mm/hr or so.

An explanation was made above about the single crystal of InP, but this method can be applied to the growth of single crystal of semiconductors with strong anisotropy such as GaSb, InSb, etc.

EXAMPLE 2

The growth of the single crystal of InP was performed using the LEC device shown in FIG. 2.

InP crystal charged weighed 1.2 kg, $B_2O_3$ weighed 200 g, and, as a crucible, quartz crucible with a size of diameter of 4 in. was used. The seed crystal of InP was one with (001) orientation and wine cup type heater was used. Ar or $N_2$ gas was introduced into the high-pressure chamber and the pressure of gas was made to be 35 $kg/cm^2$.

Figure 6:
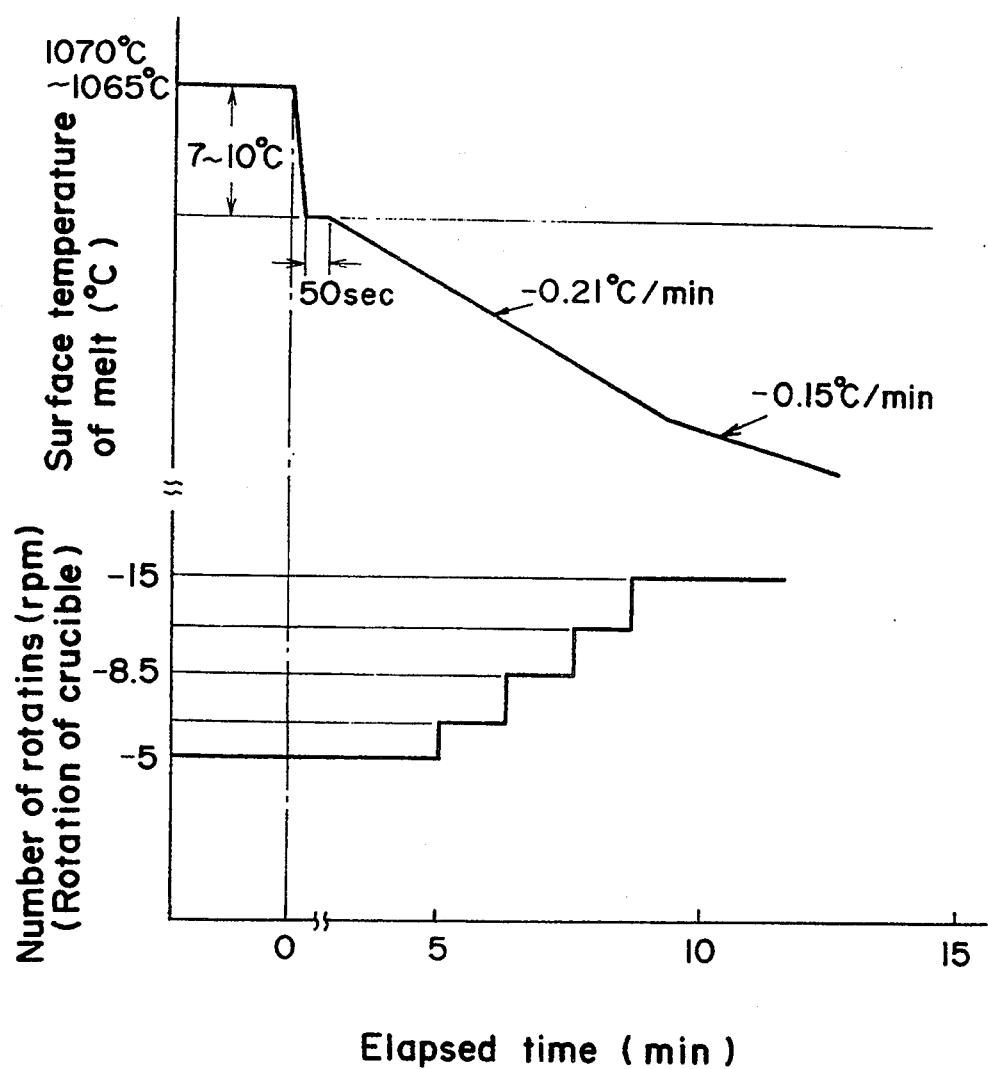
FIG. 6 is an illustration diagram showing how to decrease- the melt temperature and the change in the rotation of crucible over time at the start of growing crystal in one example of the invention.

In this way, the polycrystal raw material of InP was molten, the temperature inside the crucible was made to be 1070° C. (above 1062° C., being a melting temperature of InP), and, after made up the melt of InP, the seed crystal was brought down to dip the tip of seed crystal into the melt. At 15 minutes later after the seed crystal is dipped the into melt (after the temperature of melt had been stabilized), the growth of the crystal was started. How these temperatures are decreased and how the crucible is rotated will be illustrated using FIG. 6. The number of rotations of seed crystal is 3 rpm.

First, the temperature of melt is decreased by 7° C. or so and, at 50 seconds later, the temperature of crucible is decreased at a temperature-lowering rate of −0.21° C./min, thereby the crystal starts to grow at four corners of seed crystal. In order to make this crystal having started the growth even larger, the rotation of the crucible is gradually increased. When increasing the rotation of the crucible, the temperature at the central portion is usually decreased and, by changing the rotation of the crucible from −5 rpm to −15 rpm, the temperature of melt can be decreased by 8° C. or so.

When the crystal has been extended laterally by increasing the rotation of the crucible in this way and the shape of the crystal has been brought close to the required shape, the temperature-lowering rate is lowered (−0.15° C./min). Thus, when required diameter is reached (60 to 65 mm$\phi$), the seed crystal was pulled up at a velocity of 10 mm/hr to grow the crystal. As a result, the generation of twin or dendrite is suppressed and good single crystal of InP can be obtained.

EXAMPLE 3

Figure 7:
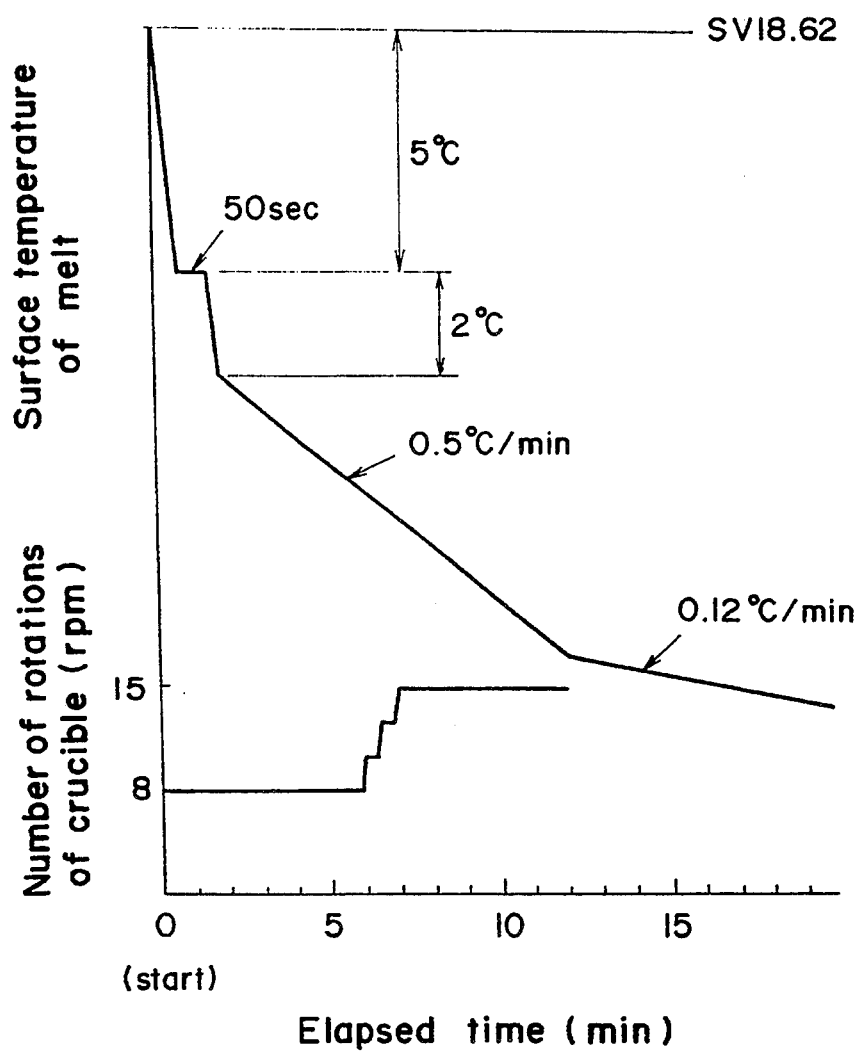
FIG. 7 is an illustration diagram showing how to decrease the temperature and how to increase the number of rotations of crucible at the start of growing in another example of the invention.

Similarly to Example 2, the growth of single crystal of InP was performed. At this time, how the temperature and how the crucible is rotated are as shown in FIG. 7.

When the way for decreasing the temperature at the beginning of growth was divided into two steps and is used when the overshoot of temperature becomes significant leading to remelt etc. The reason is that, if remelting, the crystal initially extended ends up to be molten and, when growing next, the twin ends up to incorporate from directly under the seed crystal.

Depending on the situation of melting, the rotation of the crucible is often gradually increased from 8 to 15 revolutions.

This is used when the degree of supercooling in the melt is low, thus, when the twin or dendrite is liable to incorporate at the time of changing the number of rotations. The temperature-lowering rate is also made to be −0.5° C./min being two times as high as in the case of Example 1 aforementioned. If the extending rate of crystal is low, the temperature-lowering rate is made high ($-1°$ C./min $< \Delta T/\Delta t < -0.1°$ C./min) wherein $\Delta T$ denotes the variation in the temperature on the surface of the melt during it the variation of time.

When the twin or dendrite generates on the way, the seeding is repeated again by melting again. This process has an advantage that the growth of crystal can be performed while confirming if the crystal is single crystal or not until the head portion of crystal grows to the required diameter (60 to 65 mm$\phi$) without pulling up the crystal. By the conventional method to form the shoulder angle, the head portion of crystal goes out of $B_2O_3$ if the twin is incorporated before reaching the required diameter, thus the remelting becomes impossible. This point is a significant advantage when making the head portion of crystal flat top.

Taking the above point into account, the single crystal of InP was grown according to the conditions in FIG. 7. Consequently, good single crystal was obtained similarly to Example 2.

This method of pulling up the crystal by flat top is very advantageous for the growth of crystal, because, when the head portion has been single-crystallized to the required diameter, it is only necessary to pull up the crystal at a fixed temperature. This method of growing crystal can be applied also to the growth of crystal in other compound semiconductors such as GaAs, GaSb, InSb, InAs etc.

EXAMPLE 4

Using the LEC device shown in FIG. 2, the single crystal of InP was pulled up by flat top shape.

A crucible (4) with an inner diameter of 66 mm was used and a seed with (001) orientation and a wine cup heater were used for InP seed and heater, respectively. Into the high-pressure chamber, 35 kg/cm$^2$ of Ar or $N_2$ inert gas were introduced. The amount of InP poly raw material is about 1200 g.

Figure 8:
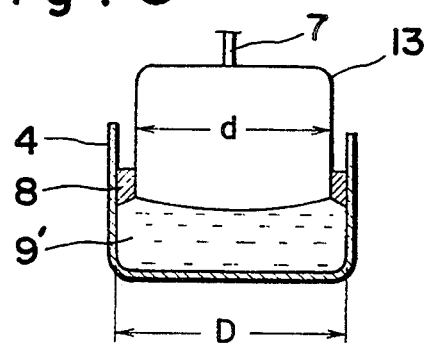
FIG. 8 is a side cross section showing the state of the crystal of InP pulled up from the crucible according to the invention.

After InP poly raw material in quartz crucible was first molten (temperature 1070° C.), InP seed was dipped into the melt and the temperature of melt was decreased stepwise by 7° to 10° C. to produce supercooling, thus growing the crystal laterally on the seed. Next, when the crystal had reached a fixed diameter between 55 and 60 mm, the pulling-up of crystal was started. The pulling-up situation of crystal is shown in FIG. 8. In the diagram, numerals (4), (7), (8), (9') and (13) indicate crucible, seed, $B_2O_3$, melt and crystal, respectively and, at the point of time when the diameter of crystal (13) had reached 60 mm, the crystal (13) was pulled up. At this time, the pulling-up velocity, the temperature-lowering rate and the thickness of $B_2O_3$ were made to be 10 mm/hr, 0.05° C./min and about 17 mm, respectively.

As a result, a crystal with uniform diameter at trunk portion was obtained as shown in FIG. 8.

Figure 9:
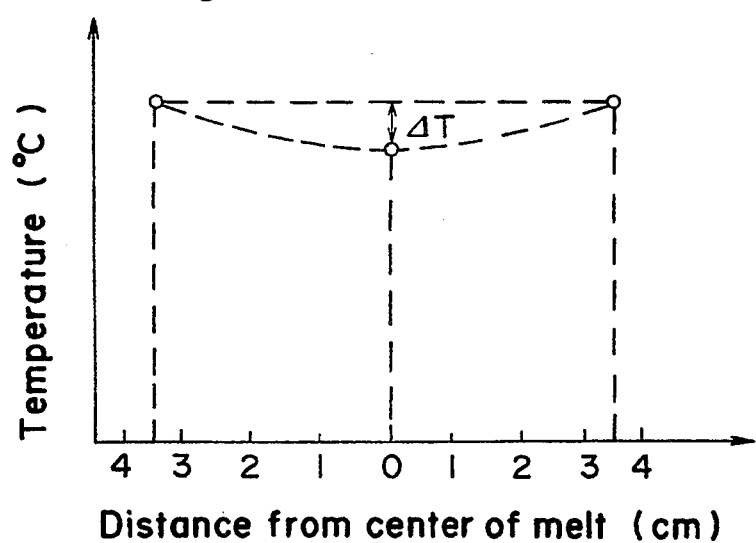
FIG. 9 is a diagram of an approximate distribution of temperature in the horizontal direction of the surface of melt in the invention.

In this way, when the diameter of crystal is brought close to the inner diameter of crucible, even if the heat radiation from the surface of crystal may change by the head portion of crystal coming out of $B_2O_3$, it becomes hard to affect the diameter of crystal and the diameter of crystal is controlled constantly. This is because, by changing the pressure of inert gas in the high-pressure chamber, the transverse distribution of temperature in the melt of InP is made so that the temperature on the wall face of crucible is $\Delta T$(5–8° C.) higher than that at central portion as shown in FIG. 9 wherein T denotes the temperature difference in the melt between the temperature on the wall face of the crucible and the temperature at the central part thereof. Namely, since the temperature on the surface of crucible is maintained higher, even if the amount of radiation heat escaping from the surface of crystal may change a little, it is hard to affect on the diameter of crystal.

Figure 10:
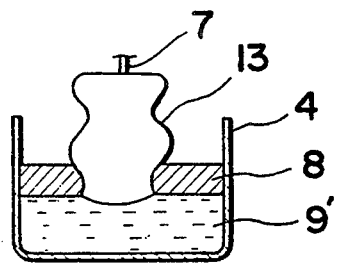
FIG. 10 is a side cross section showing the state of the crystal of InP pulled up conventionally.

Whereas, conventionally, a crucible with an inner diameter of 4 in. (about 101.6 mm) was used to pull up a crystal with a diameter of 2 in (about 50.8 mm) At this time, even if the distribution of the temperature of melt might be made similar to the invention, the diameter of crystal (13) changed upon drawing up the crystal (13) from $B_2O_3$ (8) due to the heat impact as shown in FIG. 10.

This example used a crucible with an inner diameter of 65 to 70 mm for pulling up a crystal with a diameter of 55 to 60 mm was illustrated above. When pulling up a crystal with a diameter of 80 to 85 mm, a crucible with an inner diameter of 90 to 95 mm may be used and, when pulling up a crystal with a diameter of 105 to 110 mm, a crucible with an inner diameter of 115 to 120 mm may be used, making the distribution of temperature in the melt so that the temperature becomes gradually lower it approaches the central portion of melt as described above.

Explanation was made about the growth of the single crystal of InP, but this method can also be applied to the growth of compound semiconductors such as GaAs, InAs, InSb, GaSb, GaP, etc.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of growing a single semiconductor crystal with a flat top using liquid encapsulated Czochralski method comprising the steps of:

heating a melt of raw semiconductor material in a crucible;

covering a top surface of said melt with a liquid encapsulant;

immersing said melt in a high-pressure inert gas;

dipping a seed crystal of a semiconductor compound into a top surface of said melt of raw material;

rotating said crucible at a first rotation velocity;

decreasing a temperature of said melt by about 6° to about 12° C. after dipping said seed crystal;

decreasing gradually a temperature of a central portion of said melt by gradually increasing a rotation velocity of said crucible to permit lateral growth of said crystal on said seed crystal;

waiting a until a meniscus forms about an entire circumference of said crystal;

after formation of said meniscus, decreasing a temperature-lowering rate of said melt to a first value effective to grow said crystal laterally;

said first value being from about −0.21° to about −0.88° C./min.

allowing said crystal to attain a lateral growth of from to about 30 to 40 mm$^2$;

further decreasing said temperature-lowering rate of said melt to a second value effective to stop said lateral growth of said crystal;

said second value being from about 0.13° to about 0° C./min; and pulling up said crystal at a rate effective to permit said meniscus to remain over said entire circumference, thereby preventing a facet from appearing at a shoulder portion of said crystal.

2. The method of claim 1, wherein said step of waiting until a meniscus forms about an entire circumference of said crystal includes waiting 0.5 to 2 minutes.

3. The method of claim 1, wherein said predetermined lateral growth is 30 to 40 mm$^2$.

4. The method of claim 1, wherein said step of pulling up said crystal includes:
pulling up said crystal at a pulling-up velocity of not less than 7 mm/hr.

5. The method of claim 1, further comprising:
using a crucible where D-d=5 to 15 mm and an inner diameter of said crucible for drawing up said single crystal is D mm and an outer diameter of said single crystal to be drawn up is d mm; and
distributing a temperature in a radial direction of a melt during a growing of said crystal so that said temperature of said melt decreases from a perimeter to a central portion of said melt.

6. The method of claim 1, wherein said liquid encapsulant is $B_2O_3$.

7. The method of claim 1, wherein a diameter of said single crystal is 50 to 70 mm.

8. A method for growing a crystal comprising:
melting a semiconductor raw material in a crucible to produce a melt;
heating said melt in a crucible;
rotating said crucible at a rotation rate effective to produce a temperature reduction of from 6° to 12° C. at a center of said crucible compared to a perimeter of said crucible, whereby crystal growth at said center is encouraged;
dipping a seed crystal into said center;
decreasing a temperature of said center to a first value effective to produce lateral growth about said seed crystal by increasing a rotation rate of said crucible;
continuing to grow said seed crystal laterally until a lateral size of from 30 to 40 mm$^2$ is attained;
waiting until a meniscus has formed about entire perimeter of said seed crystal;
decreasing a temperature lowering rate to a value effective to halt lateral crystal growth;
pulling up said seed crystal at a pulling rate effective to produce longitudinal growth without substantial lateral growth, whereby a single crystal is grown without appearance of a facet at a shoulder portion of said single crystal; and
said pulling rate is at least 7 mm/hr.

9. The method of claim 8 wherein said predetermined lateral size is 30 to 40 mm$^2$.

10. The method of claim 8 wherein said step of pulling up said crystal includes:
pulling up said crystal at a pulling-up velocity of not less than 7 mm/hr.

11. The method of claim 8 wherein a diameter of said single crystal is 50 to 70 mm.

12. The method of claim 8, wherein said predetermined temperature reduction is from 6° to 12° C.

13. The method of claim 8, wherein said step of waiting until a meniscus has formed about an entire perimeter of said crystal includes waiting 0.5 to 2 minutes.

14. The method of claim 8, wherein said first value is from about −0.21° to about −0.88° C./min.

* * * * *